(12) United States Patent
Nomura

(10) Patent No.: US 8,386,988 B2
(45) Date of Patent: Feb. 26, 2013

(54) SEMICONDUCTOR INTEGRATED CIRCUIT AND OPERATING VOLTAGE CONTROL METHOD

(75) Inventor: Masahiro Nomura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 136 days.

(21) Appl. No.: 13/005,289

(22) Filed: Jan. 12, 2011

(65) Prior Publication Data

US 2011/0175658 A1    Jul. 21, 2011

(30) Foreign Application Priority Data

Jan. 20, 2010  (JP) ................................. 2010-010372

(51) Int. Cl.
*H03H 11/26* (2006.01)
*G06F 17/50* (2006.01)

(52) U.S. Cl. ........ 716/133; 716/100; 716/101; 716/104; 716/134; 327/261

(58) Field of Classification Search .................. 716/100, 716/101, 104, 132, 133, 134; 327/261
See application file for complete search history.

(56) References Cited

U.S. PATENT DOCUMENTS

| | | | | |
|---|---|---|---|---|
| 6,580,287 B2 * | 6/2003 | Hsu et al. | ......................... | 326/32 |
| 7,332,947 B2 * | 2/2008 | Kumar et al. | ................. | 327/150 |
| 7,440,312 B2 * | 10/2008 | Hollis et al. | ................... | 365/154 |
| 7,701,240 B2 * | 4/2010 | Flautner et al. | ............. | 324/750.3 |
| 7,782,125 B2 | 8/2010 | Shimura | | |
| 7,802,216 B2 * | 9/2010 | Malek-Khosravi et al. | .. | 716/113 |
| 8,037,431 B2 * | 10/2011 | Boerstler et al. | ............... | 716/100 |
| 8,094,505 B2 * | 1/2012 | Khellah et al. | ........... | 365/189.09 |
| 2009/0077514 A1 | 3/2009 | Malek-Khosravi et al. | | |

FOREIGN PATENT DOCUMENTS

| | | |
|---|---|---|
| JP | 2000-216337 A | 8/2000 |
| JP | 2009-200739 A | 9/2009 |

OTHER PUBLICATIONS

Thomas Burd et al., A Dynamic Volatage Scaled Microprocessor System, IEEE International Solid-State Circuits Conference, 2000, 3 pages.

* cited by examiner

*Primary Examiner* — Sun Lin
(74) *Attorney, Agent, or Firm* — Foley & Lardner LLP

(57) ABSTRACT

A semiconductor integrated circuit includes a first circuit part that is designed under a first corner condition with respect to a process variation, a second circuit part that is designed under a second corner condition narrower than the first condition, and a control part that changes an operating voltage supplied to the first circuit part and the second circuit part according to a delay amount of the first circuit part, and starts the second circuit part when a delay characteristic caused by a change in the operating voltage conforms to a delay characteristic under the second corner condition.

14 Claims, 12 Drawing Sheets

200: MONITOR OUTPUT

200: MONITOR OUTPUT

201: CONTROL SIGNAL
200: MONITOR OUTPUT

201: CONTROL SIGNAL
200: MONITOR OUTPUT

200: MONITOR OUTPUT
Reset
310: COUNTER OUTPUT
CLKD
300: Up/Down
400: Enable

SEMICONDUCTOR INTEGRATED CIRCUIT AND OPERATING VOLTAGE CONTROL METHOD

CROSS-REFERENCE TO RELATED APPLICATIONS

The disclosure of Japanese Patent Application No. 2010-10372 filed on Jan. 20, 2010 including the specification, drawings, and abstract is incorporated herein by reference in its entirety.

BACKGROUND

1. Field of the Invention

The present invention relates to a semiconductor integrated circuit and a method of controlling an operating voltage for the semiconductor integrated circuit.

2. Description of Related Art

A reduction in the operating voltage or the operating frequency is effective in reducing a power consumption in a semiconductor integrated circuit. To achieve this, a dynamic voltage and frequency scaling (DVFS) that reduces the power consumption by dynamically controlling the operating frequency of a circuit and a supply voltage has been generally known. For example, a technique in which operation switches between one operation mode for prioritizing an operating speed and another operation mode for prioritizing a low power consumption to achieve a low power over the entire operation for a long period of time is disclosed in Burd, T., Pering, T., Stratakos, A., Broadersen, R.: "A Dynamic Voltage Scaled Microprocessor System", 2000 IEEE International Solid-State Circuits Conference 07803-5853-8/00.

In this document, the operating voltage is changed according to a difference between a frequency of a clock signal from an oscillator and a requested clock frequency. As a result, circuit operation can be conducted at a desired frequency.

As a technique for controlling a supply voltage, for example, Japanese Unexamined Patent Publication No. 2000-216337 and Japanese Unexamined Patent Publication No. 2009-200739 have been known. Japanese Unexamined Patent Publication No. 2000-216337 discloses a device for controlling the supply voltage according to the amount of delay of a replica circuit. Japanese Unexamined Patent Publication No. 2000-216337 also discloses that when the lowest voltage that enables a circuit located at a center of a process variation to normally operate is set as an initial value, a convergence time on the optimum supply voltage is shortened. Also, Japanese Unexamined Patent Publication No. 2009-200739 discloses a semiconductor integrated circuit that steps down the supply voltage across a path having a delay margin in a critical path to reduce the power.

Further, there has been known a technique in which the operating voltage is controlled to compensate the process variation. For example, U.S. Patent No. 2009/0077514 discloses a technique for conducting a design assuming a voltage control for compensating the process variation.

SUMMARY

In U.S. Patent No. 2009/0077514, the design for compensating the process variation is so conducted as not to require an unnecessary drive performance and a hold assurance buffer. As a result, the power is lowered, and the area is reduced whereas there is the possibility that malfunction is induced by voltages other than a given voltage. However, U.S. Patent No. 2009/0077514 fails to disclose a mechanism for realizing the voltage control.

Also, in U.S. Patent No. 2009/0077514, the design is made assuming that a voltage is stepped down on an FF side of process corners, and a voltage is stepped up on an SS side thereof so that the process variation is quasi reduced. However, because a voltage set time that does not allow the operation is required, there arises such a problem that it takes time to start the operation. Also, when a delay characteristic is varied due to a variation of the surrounding circumstances while a semiconductor integrated circuit is operating, in order to continue the normal operation, there is a need to stop the arithmetic processing of the semiconductor integrated circuit once, implement the voltage control so as to achieve the given voltage, and restart the arithmetic processing after achieving the given voltage.

In order to solve the above problem, the present invention employs the following means. In order to clarify the correspondence relationship between the description of "What is claimed is:" and the description of "Detailed Description of the Preferred Embodiments", numeral references and symbols used in "Detailed Description of the Preferred Embodiments" are added to in the description of the technical features that configure the means. However, the added reference numerals and symbols must never be used to definitely interpret the technical scopes of the present invention disclosed in "What is claimed is."

According to an aspect of the present invention, a semiconductor integrated circuit includes: a first circuit part (1) designed under a first corner condition with respect to a process variation; a second circuit part (2) designed under a second corner condition narrower than the first corner condition; and a control part (12) that changes an operating voltage that is applied to the first circuit part (1) and the second circuit part (2) according to a delay amount of the first circuit part (1), and starts the second circuit part (2) when a delay characteristic due to a change in the operating voltage conforms to a delay characteristic under the second corner condition.

According to another aspect of the present invention, an operating voltage control method includes: changing, according to a delay amount of a first circuit part (1) designed under a first corner condition with respect to a process variation, an operating voltage that is applied to a second circuit part (2) designed under a second corner condition narrower than the first corner condition, and the first circuit part (1); and starting the second circuit part (2) when a delay characteristic due to a change in the operating voltage conforms to a delay characteristic under the second corner condition.

According to the present invention, the start control of the semiconductor integrated circuit that compensates the process variation by controlling the operating voltage can be realized.

Also, the power consumption of the semiconductor integrated circuit can be reduced.

Further, the operating voltage that compensates the process variation during operation of the semiconductor integrated circuit can be set.

DETAILED DESCRIPTION OF THE PREFERRED EMBODIMENTS

Figure 1:
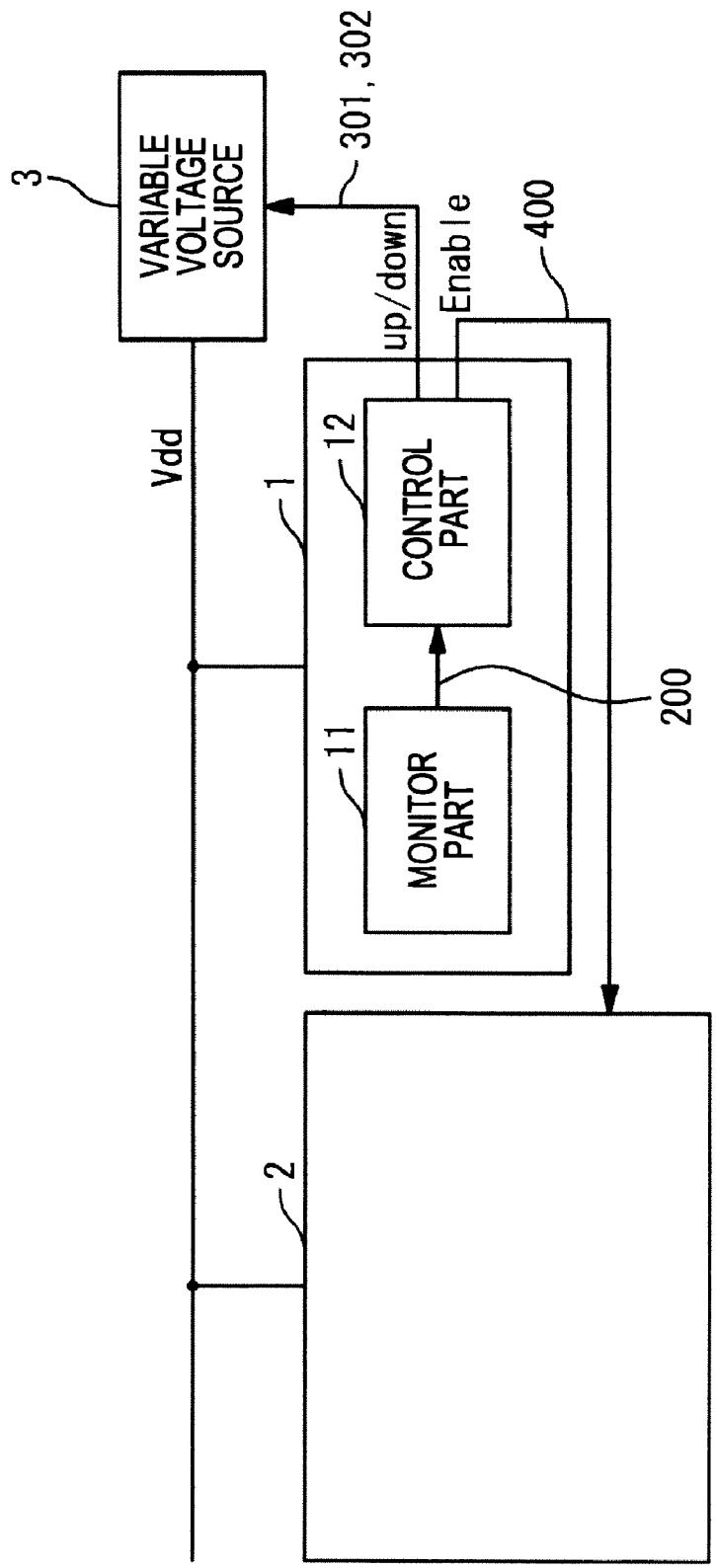
FIG. 1 is a diagram illustrating one example of the configuration of a semiconductor integrated circuit according to the present invention.

Hereinafter, embodiments of the present invention will be described with reference to the accompanying drawings. In the drawings, identical or similar reference numerals or symbols indicate identical, similar, or equivalent components.

Outline

A semiconductor integrated circuit according to the present invention includes a plurality of circuit blocks which are designed under respective different corner conditions, and to which a common operating voltage (supply voltage or/and substrate voltage) is applied. In the present invention, when the semiconductor integrated circuit starts, a circuit block (first circuit part) designed under a relatively broad corner condition (first corner condition) is first started, a variable voltage source is controlled, and a voltage for setting a delay characteristic to a given value is set. When the delay characteristic reaches the given value, the first circuit part starts a circuit block (second circuit part) designed under a narrower corner condition (second corner condition). When the narrow corner condition is set, the condition becomes lax from the viewpoint of the circuit design, and the device variation resistance becomes strict. On the other hand, when the wide corner condition is set, the condition becomes strict from the viewpoint of the circuit design, and the device variation resistance becomes lax.

In this example, the corner condition includes two process corners that are minimum (fast) and maximum (slow) in delay value with respect to any one of a process (Process), a supply voltage (Vdd), a threshold voltage (Vt), and a temperature condition (Temperature). The first circuit part is designed under the wide first corner condition. For that reason, in a chip of a certain device variation, a range of the operating voltage that enables the first circuit part to achieve a desired processing performance and normal operation is wide. On the other hand, a range of the operating voltage that enables the second circuit part designed under the second corner condition narrower than the first corner condition to achieve a desired processing performance and normal operation is narrower than that of the first circuit part.

The first circuit part is operable even if the applied operating voltage is small or large to some extent because the voltage range that enables the desired processing performance and the normal operation is wide. For that reason, even when the initial voltage of the operating voltage is varied due to noises or the like, or largely deviated from the desired operating voltage due to a change in the surrounding circumstances during operation, the possibility that the first circuit part malfunctions becomes low.

According to the present invention, the first circuit part operates before the second circuit part, and this operation result (delay amount) is fed back to a value of the operating voltage to determine the magnitude of the operating voltage. The second circuit part starts the operation at the operating voltage set by the first circuit part. When the operating voltage set by the first circuit part is a value conforming to the delay characteristic of the second corner condition, the second circuit part does not malfunction. That is, the process variation of the second circuit part is compensated by the voltage control made by the first circuit part.

Also, because the operating voltage is so controlled as to conform to the delay characteristic of the second corner condition, the power consumption can fall within a desired range. According to the present invention, when the operating voltage is higher than a value determined according to the delay characteristic of the second corner condition, the operating voltage is so controlled as to be stepped down, and the power consumption is reduced.

Further, when the delay is changed due to a variation in the surrounding environments, and the present operating voltage becomes a value deviated from the delay characteristic of the second corner condition, the operation of the second circuit part may stop. While the second circuit part is stopping, the operating voltage is set to the desired value by the first circuit part. The second circuit part restarts the operation after the operating voltage has been set to the desired value. As a result, the malfunction of the second circuit part can be prevented, and useless power consumption can be prevented because the operation that may be malfunction is not conducted.

Hereinafter, a semiconductor integrated circuit and a method of controlling the operating voltage will be described in detail.

1. First Embodiment

The semiconductor integrated circuit according to a first embodiment of the present invention will be described with FIGS. 1 to 9. FIG. 1 is a diagram illustrating one example of the configuration of a semiconductor integrated circuit according to the present invention. Referring to FIG. 1, the semiconductor integrated circuit according to the present invention includes a circuit part 1 designed under a first corner condition, a circuit part 2 designed under a second corner condition, and a variable voltage source 3.

Figure 2:
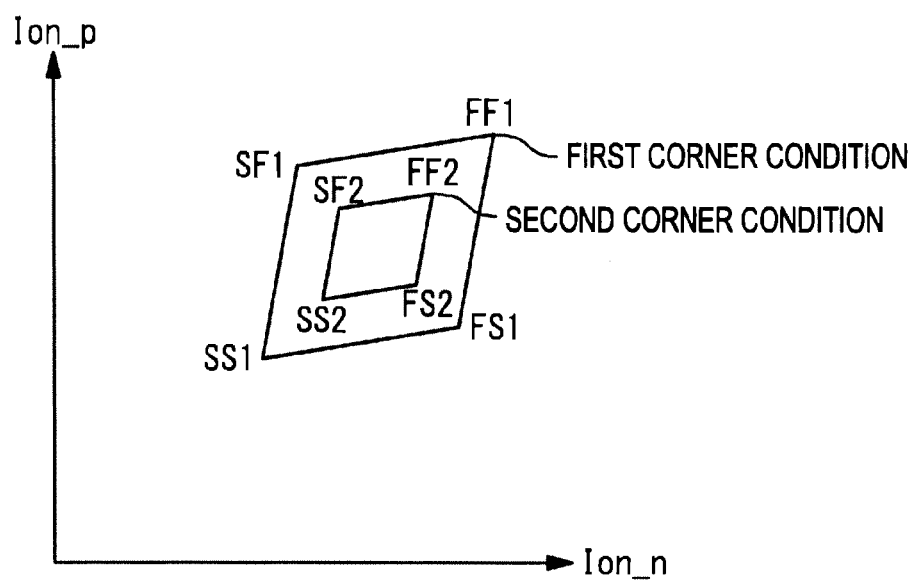
FIG. 2 is a graph showing one example of corner conditions according to the present invention.

FIG. 2 is a graph showing an example of the corner conditions according to the present invention. The circuit parts 1 and 2 are circuit blocks each having a complementary metal oxide semiconductor (CMOS). Referring to FIG. 2, it is assumed that an on-state current Ion_P of a p-channel MOS transistor in the CMOS is on the Y-axis, an on-state current Ion_N of an n-channel MOS transistor is on the X-axis. It is also assumed that a current value (FAST) of the smallest delay amount is F, and a current value (SLOW) of the largest delay amount is S. The corner conditions are represented by combination of F and S corresponding to the on-state current Ion_P and the on-state current Ion_N, respectively, that is, regions surrounded by straight lines FF, FS, SF, and SS. The corner conditions shown in FIG. 2 are represented by the on-state currents of the transistor, but may be represented by another parameter (a threshold voltage of the transistor).

The second corner condition (FF2, FS2, SF2, SS2) is set to a condition narrower than the first corner condition (FF1, FS1, SF1, SS1). For that reason, the circuit part 2 designed under the second corner condition is narrower in an allowable range of the process variation than the circuit part 1 designed under the first corner condition, and also narrower than the circuit part 1 in a range of the operating voltage that enables the desired processing performance and the normal operation with respect to a certain chip.

Referring to FIG. 1, the circuit part 1 according to the first embodiment includes a monitor part 11 and a control part 12. The monitor part 11 according to the first embodiment detects a delay amount of the circuit part 1, and outputs the detected delay amount to the control part 12. The control part 12 controls the variable voltage source 3 on the basis of the delay amount. In more detail, the control part 12 compares a reference value of the delay amount with the detected delay amount, and outputs an up signal 301 or a down signal 302 according to the comparison results to control the operating voltage (supply voltage Vdd in this example). The variable voltage source 3 varies the amplitude of the operating voltage (supply voltage Vdd) according to the up signal 301 or the down signal 302. The circuit parts 1 and 2 operate according to the operating voltage supplied from the variable voltage source 3.

When the operating voltage reaches a value indicative of a given delay characteristic, the control part 12 outputs an enable signal 400 to the circuit part 2. The circuit part 2 starts the operation according to the enable signal 400. For example, the circuit part 2 operates according to the enable signal 400 of a high level "1", and stops the operation according to the enable signal 400 of a low level "0".

Also, it is preferred that power gating or clock gating according to the enable signal 400, or both of those gating are controlled while the circuit part 2 stops. For example, a power switch is prepared to control the power supply to the circuit part 2, and interrupts the power supply to the stopping circuit part 2 according to the enable signal 400 (retains necessary data) to eliminate a leak current. As a result, the power consumption is reduced. In this case, the power gating is canceled according to the enable signal 400, and when the power supply is stabilized (after a given period of time has elapsed, or according to an instruction from a power monitor). As occasion demands, a program counter may be reset at the same time for initialization.

Figure 3:
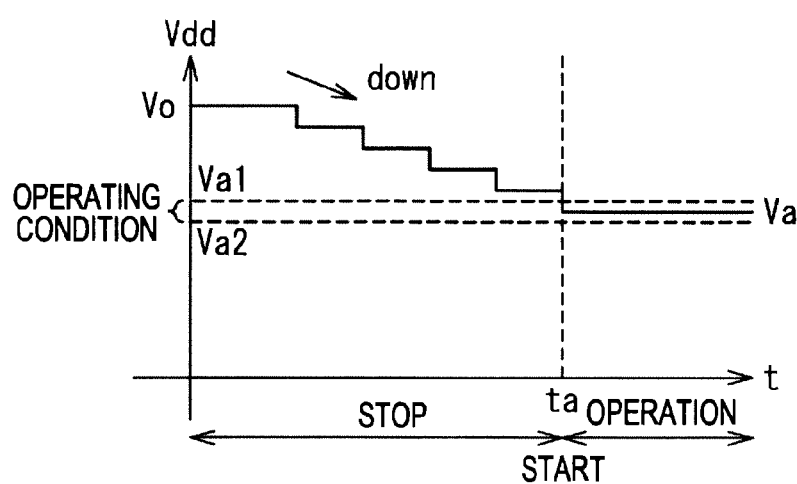
FIG. 3 is a graph showing one example of voltage control operation according to the present invention.
Figure 4:
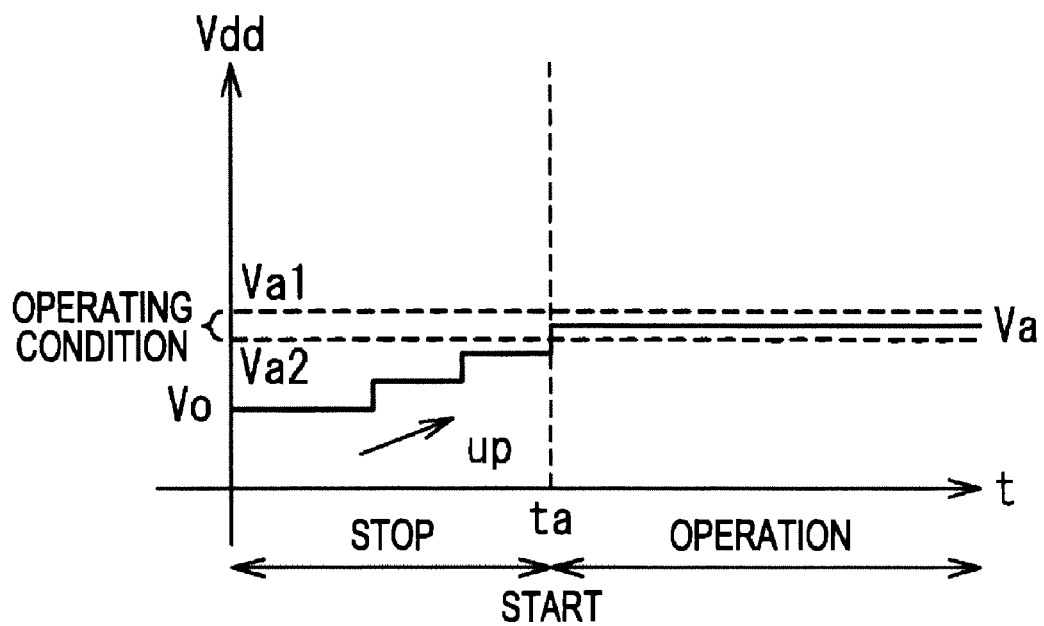
FIG. 4 is a graph showing another example of voltage control operation according to the present invention.

FIGS. 3 and 4 are graphs showing examples of the voltage control operation according to the present invention. In the following description, it is assumed that an initial voltage (control start voltage) is 0V, a voltage range that enables a desired processing performance and the normal operation in the circuit part 2 is from Va1 to Va2 (Va1>Va2). When the voltage range of the operating voltage is from vat to Va2, the process variation of the circuit part 2 becomes an amplitude (voltage Va) conforming to the second corner condition, and the circuit part 2 stably operates. That is, the operating voltage is controlled to the voltage Va that is in a range of from Va1 to Va2, thereby compensating the process variation of the circuit part 2.

Referring to FIG. 3, when the operating voltage is larger than an upper limit (Va1) of the operating condition, the control part 12 outputs the down signal 302 to drop the operating voltage. As a result of the voltage drop, when the operating voltage reaches a value in a range of the operating conditions Va1 to Va2, the control part 12 sets the enable signal 400 to the high level "1" in order to start the circuit part 2 (time ta). Also, the control part 12 controls the variable voltage source 3 so that the magnitude of the operating voltage is kept to the voltage Va after the time ta. As a result, the process variation of the circuit part 2 is compensated. Also, in the example shown in FIG. 3, because the operating voltage (supply voltage Vdd) has been changed to a value lower than an initial voltage V0, the power consumption of the semiconductor integrated circuit is reduced.

Referring to FIG. 4, when the operating voltage is smaller than a lower limit (Va2) of the operating condition, the control part 12 outputs the up signal 301 to raise the operating voltage. As a result of the voltage raising, when the operating voltage reaches a value (voltage Va) in a range of the operating conditions Va1 to Va2, the control part 12 sets the enable signal 400 to the high level "1" in order to start the circuit part 2 (time ta). Also, the control part 12 controls the variable voltage source 3 so that the magnitude of the operating voltage is kept to the voltage Va after the time ta. As a result, the process variation of the circuit part 2 is compensated.

When the operating voltage (supply voltage Vdd) is varied during operation of the circuit part 2, and falls outside the operating conditions Va1 to Va2, the operating voltage is corrected by the up signal 301 or the down signal 302 to the voltage Va in the range of from Va1 to Va2 enabling the circuit part 2 to operate, in the same manner as that described above. It is preferred that, during the correction, the control part 12 outputs the enable signal 400 of the low level "0" to stop the operation of the circuit part 2.

Referring to FIGS. 5 to 9, examples of the specific configuration and operation of the monitor part 11 and the control part 12 according to the first embodiment will be described.

Figure 5:
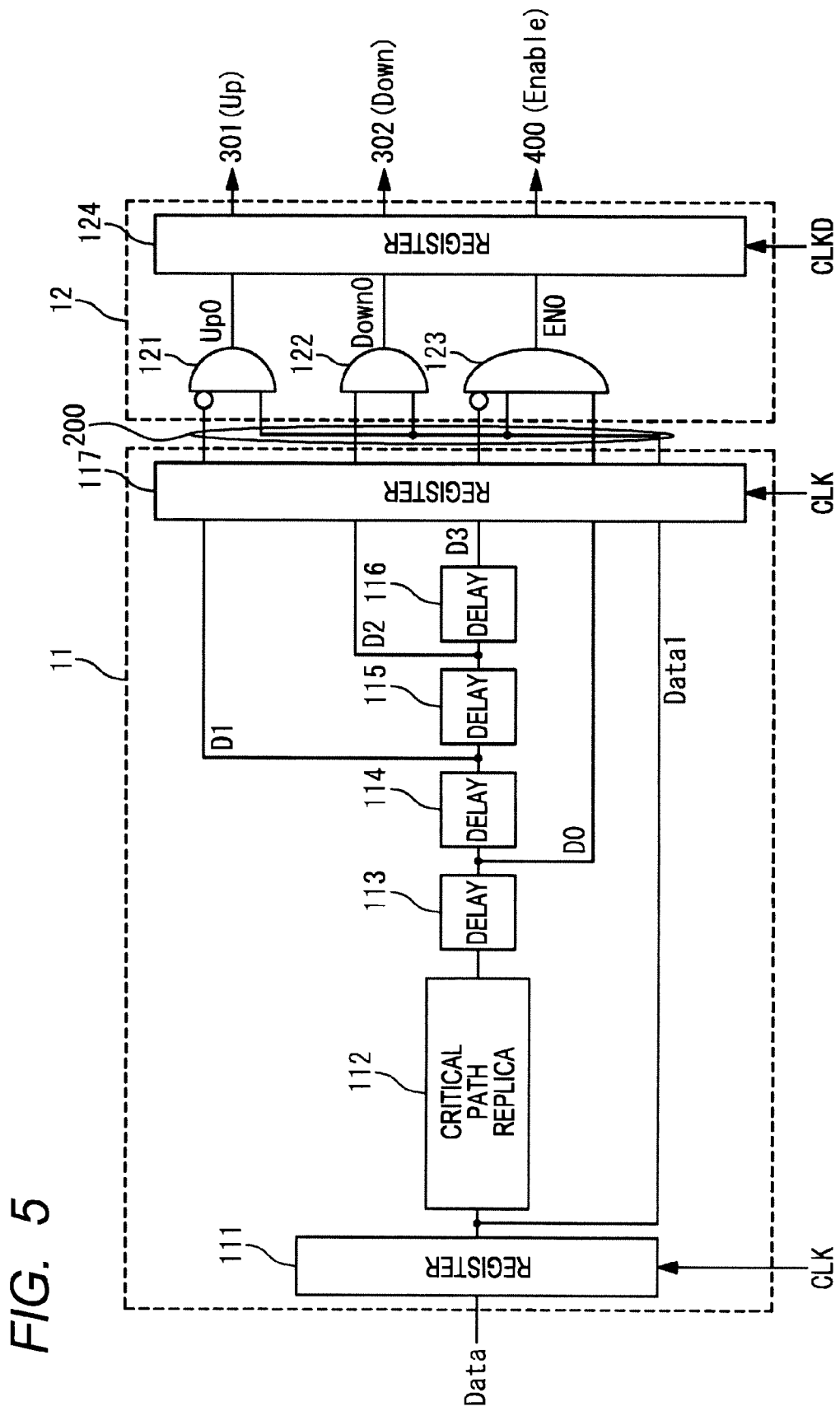
FIG. 5 is a diagram illustrating a monitor part and a control part according to a first embodiment of the present invention.

FIG. 5 is a diagram illustrating the configurations of the monitor part 11 and the control part 12 according to the first embodiment of the present invention. Referring to FIG. 5, the monitor part 11 includes registers 111, 117, a critical path replica 112, and delay circuits 113 to 116. The control part 12 includes AND circuits 121 to 123 and a register 124.

The register 111 latches an input data signal DATA according to a clock signal CLK, and outputs the latched data signal to the critical path replica 112 and the register 117 as a data signal DATA1. The data signal DATA1 that has passed through the critical path replica 112 is output to the register 117 through the four delay circuits 113 to 116.

The delay circuits 113 to 116 delay the input data signals by given delay mounts, and then output the delayed data signals as data signals D0 to D3, respectively. The delay amounts of the delay circuits 113 to 116 are so set as to conform to a desired second corner condition. In this example, the delay amount for the data signal D0 is set to be smallest, the delay amount for the data signal D1 is set to be smaller, and the delay amount for the data signal D2 is set to be larger, and the delay amount for the data signal D3 is set to be largest. That is, the data signals D0 to D3 are increased in the data amount in the stated order. Although the details will be described later, a control method of the operating voltage (stepping up or stepping down the voltage), and whether the circuit part 2 is operated, or not, (logic level of the enable signal 400) are set according to phase differences of the data signals D0 to D3 at latch timing of the data signal DATA1 responsive to the clock signal CLK.

The delay amount (smallest delay value) of the data signal D0 and the delay amount (largest delay value) of the data signal D3 with respect to the data signal DATA1 are set to correspond to the uppermost limit and the lowest limit of the delay amount for compensating the second corner condition. Also, the delay amount (smaller delay value) of the data signal D1 with respect to the data signal DATA1 is set to correspond to a reference delay value (hereinafter referred to as "lower limit") for determining whether the operating voltage is stepped up, or not. Further, the delay amount (larger delay value) of the data signal D2 with respect to the data signal DATA1 is set to correspond to a reference delay value (hereinafter referred to as "upper limit") for determining whether the operating voltage is stepped down, or not.

The control part 12 compares phase differences of monitor outputs 200 (the data signals D0 to D3, and the data signal DATA1) from the monitor part 11 with each other to detect an arrival delay amount of a given time (hereinafter referred to simply as "arrival delay time") corresponding to the operating voltage. When the arrival delay amount is a value between the uppermost limit and the lowest limit, the control part 12 sets a signal level of the enable signal 400 to the high level "1" to operate the circuit part 2. On the other hand, when the arrival delay amount is a value falling outside a range between the uppermost limit and the lowest limit, the control part 12 sets the signal level of the enable signal 400 to the low level "0" to stop the operation of the circuit part 2. Also, when the arrival delay amount is smaller than the lower limit, the control part 12 outputs the up signal 301 for stepping up the operating voltage. When the arrival delay amount is larger than the upper limit, the control part 12 outputs the down signal 302 for stepping down the operating voltage.

The register 117 latches the data signals D0 to D3 and the data signal Data1 according to the clock signal CLK, and output the latched signals to the AND circuits 121 to 123. The AND circuit 121 outputs the logical AND of an inversion signal of the data signal D1 and the data signal Data1 as an up signal (Up0). The AND circuit 122 outputs the logical AND of the data signal D2 and the data signal Data1 as a down signal (Down0). The AND circuit 123 outputs the logical AND of an inversion signal of the data signal D3, the data signal D0, and the data signal Data1 as an enable signal (EN0). The register 124 latches the up signal (Up0), the down signal (Down0), and the enable signal (EN0) according to a given clock signal CLKD, and outputs those latched signals as the up signal 301, the down signal 302, and the enable signal 400, respectively.

When the data signal D1 is latched as "0" at timing when the data signal DATA1 is latched, the control part 12 determines that the arrival delay amount is smaller than a desired lower limit, and steps up the operating voltage. When the data signal D2 is latched as "1" at timing when the data signal DATA1 is latched, the control part 12 determines that the arrival delay amount is larger than a desired upper limit, and steps down the operating voltage. When the data signal D0 is latched as "1" and the data signal D3 is not latched as "1" at timing when the data signal DATA1 is latched, the control part 12 determines that the arrival delay amount is larger than a desired lowest limit and smaller than a desired uppermost limit, and sets the enable signal 400 to the high level "1" to operate the circuit part 2.

Figure 10:
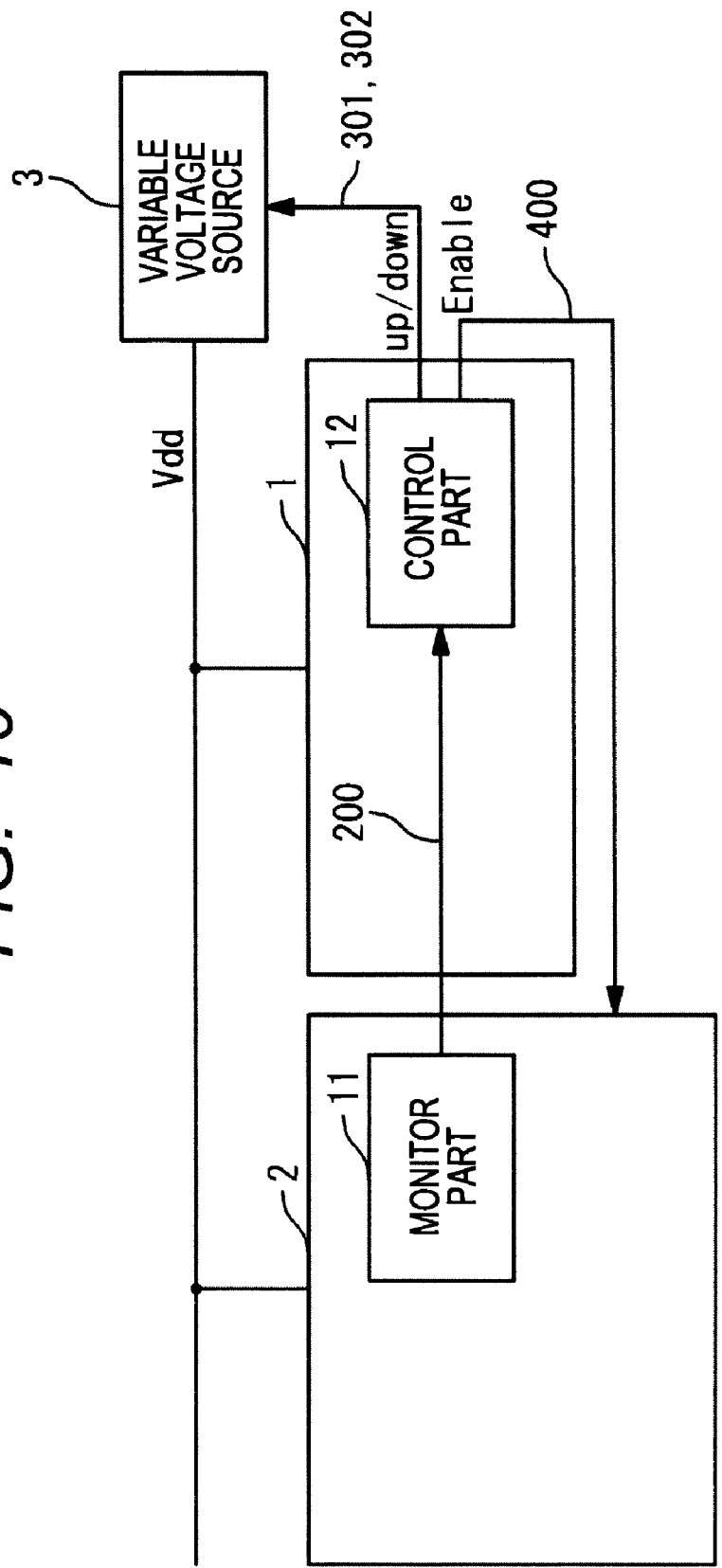
FIG. 10 is a diagram illustrating another example of the configuration of a semiconductor integrated circuit according to the present invention.

In the semiconductor integrated circuit according to the first embodiment, the critical path replica 112 and the clock signal CLK are compared in phase with each other to determine whether the arrival delay amount falls within a desired range, or not. Because the delay amount of the critical path replica 112 is large, a hold margin that is a basis for determining whether malfunction occurs, or not, becomes large. For that reason, when a hold compensation buffer that is sufficiently smaller than the critical path replica 112 is added to the data signal Data1 in advance, an influence of a hold time on the malfunction is small. On the other hand, a setup margin is varied with the process variation. Hence, the monitor part 11 can be not only designed under the first corner condition and arranged in the circuit part 1 as illustrated in FIG. 1, but also designed under the second corner condition and arranged in the circuit part 2 as illustrated in FIG. 10. In this case, the monitor part 11 needs to be operated without waiting for start-up of the circuit part 2. The control part 12 controls the setup time (delay amount) of the critical path replica 112 to a desired value, thereby enabling the operating voltage to be changed to an operating voltage for compensating the process variation.

After the control part 12 has controlled the operating voltage to the operating voltage for compensating the process variation according to the second corner condition, the control part 12 operates the circuit part 2. As a result, the malfunction in the circuit part 2 can be prevented. In more detail, at the latch timing responsive to the clock signal CLK, the second corner condition is defined in a state where the data signal D0 is the high level "1", and the data signal D3 is the low level "0", particularly in a state where the data signal D1 is the high level "1", and the data signal D2 is the low level "0". Also, when the respective delay amounts of the delay circuits 113 to 116 are set to appropriate values (not limited to a uniform value), ranges of SS2 and FF2 in the second corner condition can be set to an equal position. Also, when the delay amount of the delay circuit 114 is sufficiently large, the delay amount of the delay circuit 113 can be reduced, and as occasion demands, the delay circuit 113 can be deleted.

Also, for the purpose of preventing metastable, the control part 12 needs to be designed with a sufficient margin of the phase of the clock signal CLKD at the control side for loading the monitor outputs 200 assuming the first corner condition. Alternatively, the control part 12 needs to add a register and reset the timing. In particular, care should be taken when the monitor part 11 is designed under the second corner condition and arranged in the circuit part 2, as illustrated in FIG. 10.

Hereinafter, the voltage control operation according to the present invention will be described in detail with reference to FIGS. 6 to 9.

Figure 6:
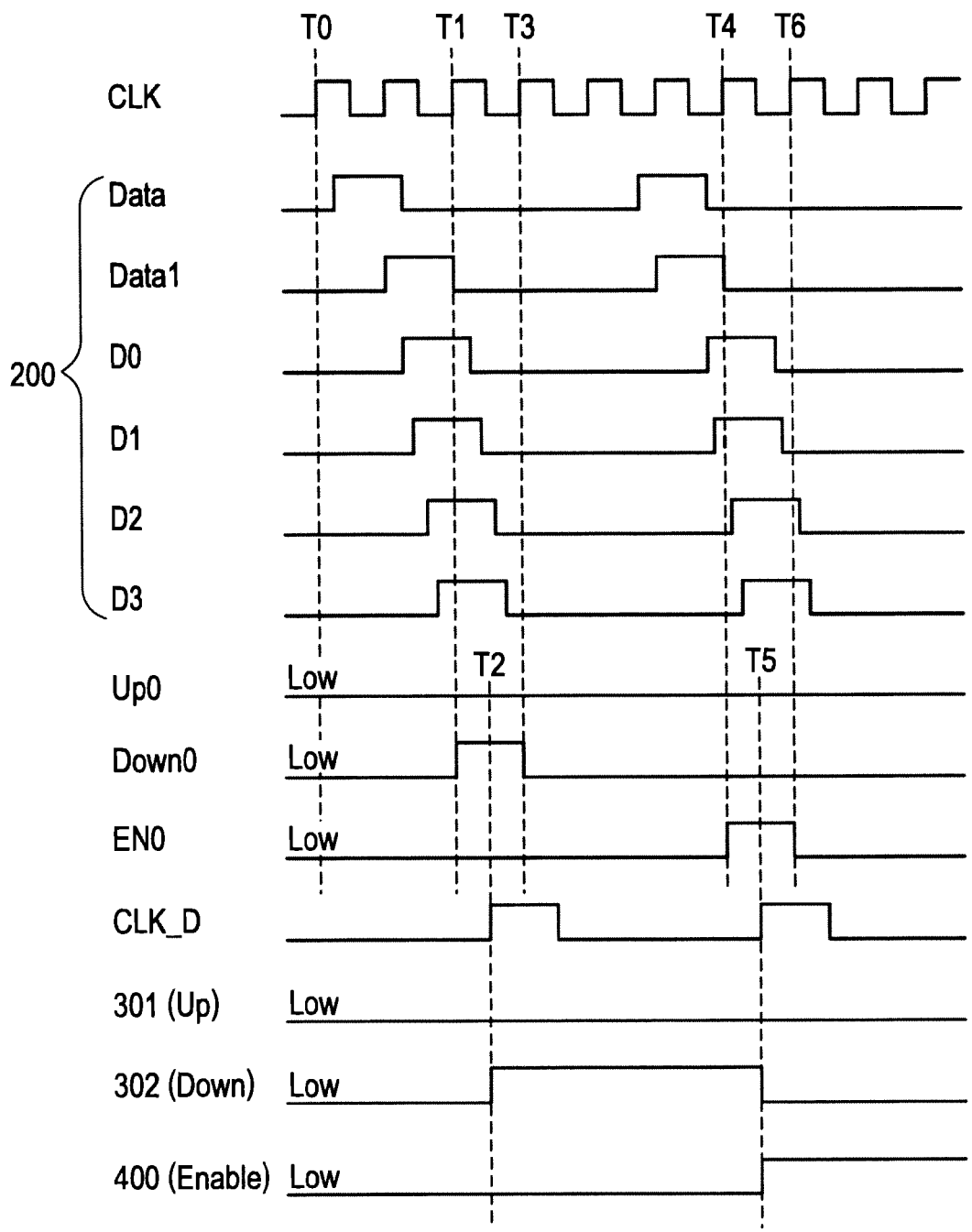
FIG. 6 is a timing chart showing one example of voltage control operation (step-down operation) according to the first embodiment.

FIG. 6 is a timing chart showing one example of the voltage control operation (step-up operation) according to the first embodiment. Referring to FIG. 6, the voltage control operation when the operating voltage is higher than a desired value (a voltage value for compensating the process variation of the circuit part 2) will be described. In this example, the voltage control operation in a state where the circuit part 2 stops, at a time T0 (initial state) will be described.

Between the time T0 and the time t1, because the data signal Data1 of the low level "0" is latched according to the clock signal CLK, the up signal (Up0), the down signal (Down0), and the enable signal (EN0) become low level. During this period, because no clock signal CLKD is input, the up signal 301, the down signal 302, and the enable signal 400 are maintained at the low level.

At a time T1, the data signal Data1 of the high level "1" is latched according to the clock signal CLK. At this time, because the data signal D2 is high level "1", the down signal Down0 from the AND circuit 122 becomes high level. Also, because the data signal D1 is high level "1", the up signal Up0 from the AND circuit 121 becomes low level. Further, because the data signal D3 is high level "1", the enable signal EN0 from the AND circuit 123 becomes low level.

At a time T2, the down signal Down0 of the high level "1" is latched according to the clock signal CLK, and the down signal 302 becomes high level. Likewise, at the time T2, the up signal Up0 and the enable signal EN0 of the low level "0" are latched, and the up signal 301 and the enable signal 400 become low level.

Between a subsequent time T3 and a time T4, because the data signal Data1 of the low level "0" is latched according to the clock signal CLK, the up signal (Up0), the down signal (Down0), and the enable signal (EN0) become low level.

At a time T4, the data signal Data1 of the high level "1" is latched. At this time, because the data signal D2 is low level "0", the down signal Down0 from the AND circuit 122 becomes low level. Also, because the data signal D1 is high level "1", the up signal Up0 from the AND circuit 121 becomes low level. Further, because the data signal D3 is low level "0", the enable signal EN0 from the AND circuit 123 becomes high level.

At a time T5, the enable signal EN0 of the high level "1" is latched according to the clock signal CLKD, and the enable signal 400 becomes high level. Likewise, at the time T5, the up signal Up0 and the down signal Down0 of the low level "0" are latched, and the up signal 301 and the down signal 302 become low level.

After a subsequent time T6, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the down signal 302 are maintained at the low level, and the enable signal 400 are maintained at the high level.

As described above, in the example shown in FIG. 6, it is determined that the arrival delay amount of the monitor outputs 200 is larger than the upper limit at the time T1, and the down signal 302 for stepping down the operating voltage is output at the timing (time T2) responsive to the clock signal CLKD. As a result, the variable voltage source 3 steps down the operating voltage. Also, at the time T1, because the data signal D3 is high level, it is determined that the arrival delay amount of the monitor outputs 200 is larger than the uppermost limit, and the enable signal 400 of the low level is output. As a result, the circuit part 2 is maintained in the operation stop state.

When the operating voltage is stepped down according to the down signal 302, the arrival delay amount of the monitor outputs 200 is reduced. At the time T4, when it is determined that the arrival delay amount is smaller than the upper limit, the down signal 302 becomes low level, and the control part 12 stops the step-down operation of the operating voltage. At this time, it is determined that the delay amount is larger than the lowest limit, but smaller than the uppermost limit because the data D0 is high level and the data D3 is low level. Then, the enable signal 400 of the high level is output. As a result, the circuit part 2 starts the operation from the time T5.

Figure 7:
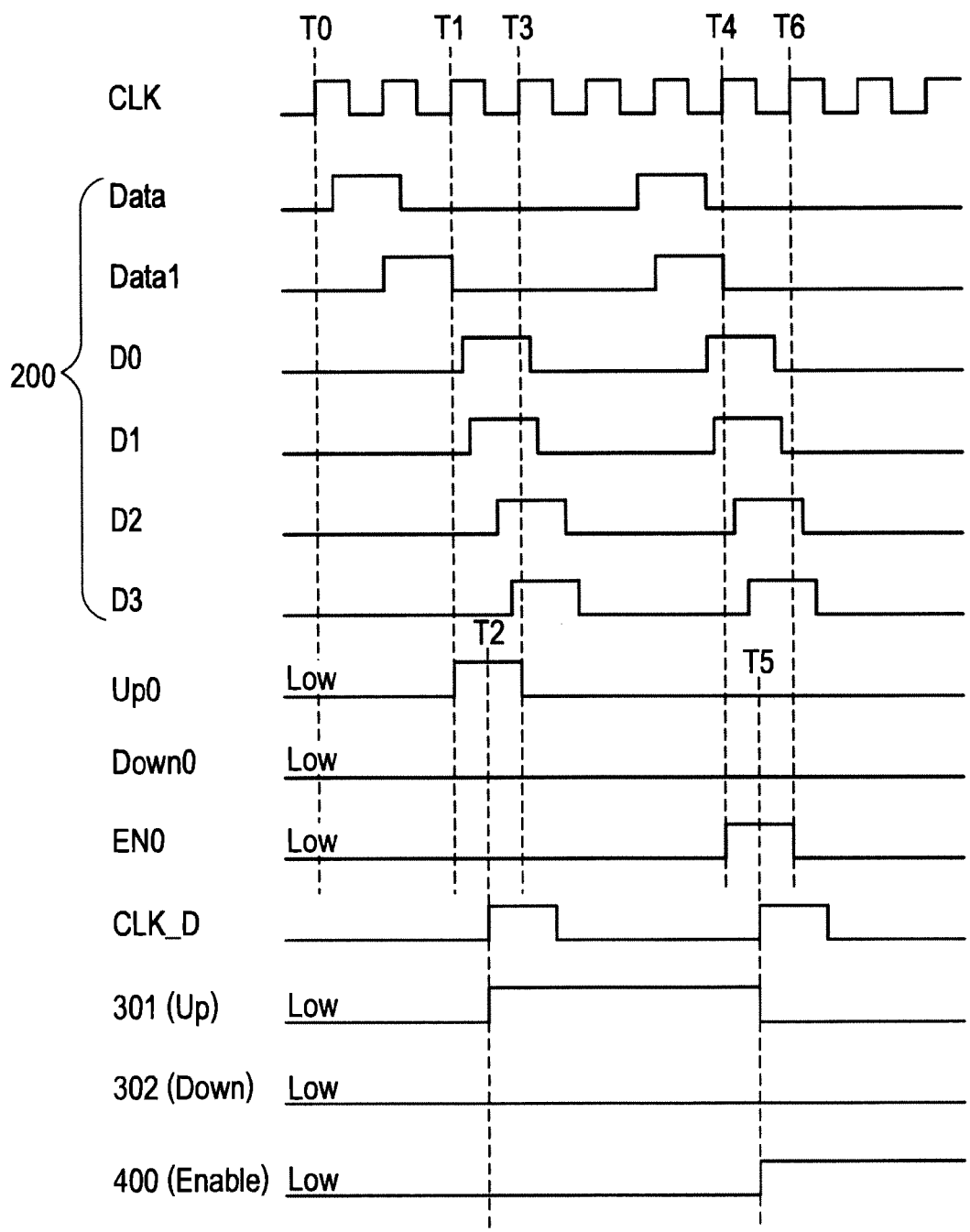
FIG. 7 is a timing chart showing one example of the voltage control operation (step-up operation) according to the first embodiment.

FIG. 7 is a timing chart showing one example of the voltage control operation (step-up operation) according to the first embodiment. The voltage control operation when the operating voltage is lower than a desired value (a voltage value for compensating the process variation of the circuit part 2) will be described with reference to FIG. 7. In this example, the voltage control operation in a state where the circuit part 2 stops, at the time T0 (initial state) will be described.

Between the time T0 and the time T1, because the data signal Data1 of the low level "0" is latched according to the clock signal CLK, the up signal (Up0), the down signal (Down0), and the enable signal (EN0) become low level. During this period, because no clock signal CLKD is input, the up signal 301, the down signal 302, and the enable signal 400 are maintained at the low level.

At the time T1, the data signal Data1 of the high level "1" is latched according to the clock signal CLK. At this time, because the data signal D1 is low level "0", the up signal Up0 from the AND circuit 121 becomes high level. Also, because the data signal D2 is low level "0", the down signal Down0 from the AND circuit 122 becomes low level. Further, because the data signal D0 is low level "0", the enable signal EN0 from the AND circuit 123 becomes low level.

At the time T2, the up signal Up0 of the high level "1" is latched according to the clock signal CLK, and the up signal 301 becomes high level. Likewise, at the time T2, the down signal Down0 and the enable signal EN0 of the low level "0" are latched, and the down signal 302 and the enable signal 400 become low level.

Between the subsequent time T3 and the time T4, because the data signal Data1 of the low level "0" is latched according to the clock signal CLK, the up signal (Up0), the down signal (Down0), and the enable signal (EN0) become low level.

At the time T4, the data signal Data1 of the high level "1" is latched. At this time, because the data signal D2 is low level "0", the down signal Down0 from the AND circuit 122 becomes low level. Also, because the data signal D1 is high level "1", the up signal Up0 from the AND circuit 121 becomes low level. Further, because the data signal D3 is low level "0", the enable signal EN0 from the AND circuit 123 becomes high level.

At the time T5, the enable signal EN0 of the high level "1" is latched according to the clock signal CLKD, and the enable signal 400 becomes high level. Likewise, at the time T5, the up signal Up0 and the down signal Down0 of the low level "0" are latched, and the up signal 301 and the down signal 302 become low level.

After the subsequent time T6, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the down signal 302 are maintained at the low level, and the enable signal 400 are maintained at the high level.

As described above, in the example shown in FIG. 7, it is determined that the arrival delay amount of the monitor outputs 200 is smaller than the lower limit at the time T1, and the up signal 301 for stepping up the operating voltage is output at the timing (time T2) responsive to the clock signal CLKD. As a result, the variable voltage source 3 steps up the operating voltage. Also, at the time T1, because the data signal D0 is low level, it is determined that the arrival delay amount of the monitor outputs 200 is smaller than the lowest limit, and the enable signal 400 of the low level is output. As a result, the circuit part 2 is maintained in the operation stop state.

When the operating voltage is stepped up according to the up signal 301, the arrival delay amount of the monitor outputs 200 is increased. At the time T4, when it is determined that the arrival delay amount is larger than the lower limit, the up signal 301 becomes low level, and the control part 12 stops the step-up operation of the operating voltage. At this time, it is determined that the delay amount is larger than the lowest limit, but smaller than the uppermost limit because the data D0 is high level and the data D3 is low level. Then, the enable signal 400 of the high level is output. As a result, the circuit part 2 starts the operation from the time T5.

As shown in FIGS. 6 and 7, in the present invention, the circuit part 2 is operated after the operating voltage has been set to the magnitude for compensating the process variation of the circuit part 2 by the operation of the circuit part 1. As a result, the semiconductor integrated circuit can start without any delay while preventing malfunction caused by the process variation. That is, according to the present invention, the voltage is so controlled as to compensate the process variation by the circuit part 1 designed under the first corner condition to start the circuit part 2. This eliminates a problem that how the start of the circuit part 2 is realized, which is not proposed by the conventional art.

Figure 8:
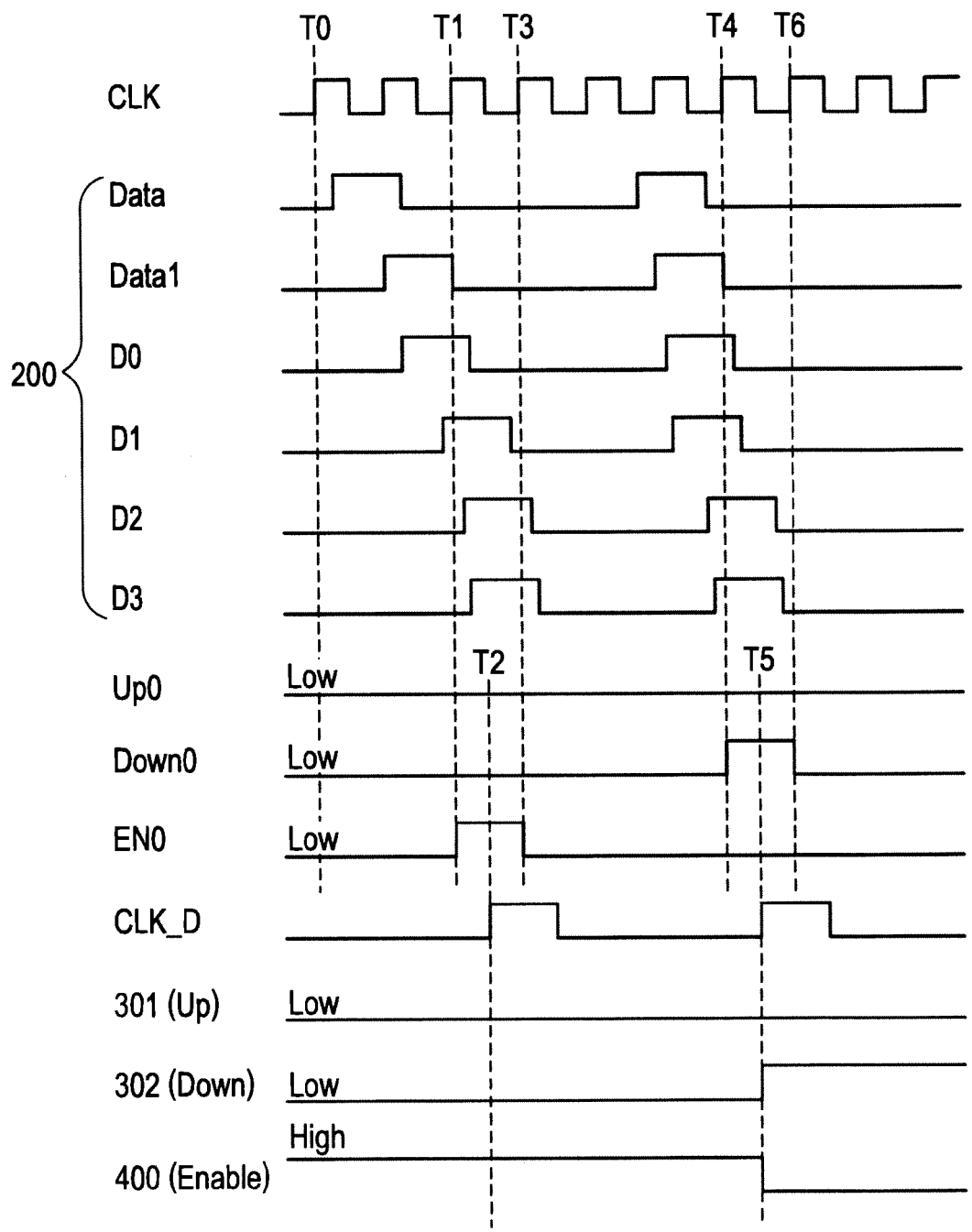
FIG. 8 is a timing chart showing another example of the voltage control operation (step-down operation) according to the first embodiment.

FIG. 8 is a timing chart showing an example of the voltage control operation (step-down operation) according to the first embodiment. It is preferred that the control part 12 controls the operating voltage to a desired value not only at the time of starting the semiconductor integrated circuit, but also during the operation thereof. For example, there is a case in which the delay time is varied according to the variation of the surrounding environments during the operation of the circuit part 2, and the present operating voltage does not become a suitable value for the circuit part 2. In this case, the control part 12 stops the circuit part 2, and changes the operating voltage. Referring to FIG. 8, a description will be given of the voltage control operation when the arrival delay amount increases, and the present operating voltage is regarded as a value higher than a desired value (voltage value for compensating the process variation of the circuit part 2) during the operation of the circuit part 2.

Between the time T0 and the time t1, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the down signal 302 are maintained at the low level, and the enable signal 400 is maintained at the high level.

At the time T1, the data signal Data1 of the high level "1" is latched according to the clock signal CLK. At this time, because the data signal D1 is high level "1", the up signal Up0 from the AND circuit 121 becomes low level. Also, because the data signal D2 is low level "0", the down signal Down0 from the AND circuit 122 becomes low level. Further, because the data signal D0 is high level "1" and the data signal D3 is low level "0", the enable signal EN0 from the AND circuit 123 becomes high level.

At the time T2, the enable signal EN0 of the high level "1" is latched according to the clock signal CLKD, and the enable signal 400 is maintained at the high level. Likewise, at the time T2, the up signal Up0 and the enable signal EN0 of the low level "0" are latched, and the up signal 301 and the down signal 302 are maintained at the low level.

Between the subsequent time T3 and the time T4, because the data signal Data1 of the low level "0" is latched according to the clock signal CLK, the up signal (Up0), the down signal (Down0), and the enable signal (EN0) become low level.

On the other hand, the surrounding environments are varied between the time T3 and the time T4, thereby varying the arrival delay amount of the monitor outputs 200. In this example, the arrival delay amount of the monitor outputs increases.

At the time T4, the data signal Data1 of the high level "1" is latched according to the clock signal CLK. At this time, because the data signal D2 is high level "1" due to an increase in the arrival delay amount, the down signal Down0 from the AND circuit 122 becomes high level. Also, because the data signal D1 is high level "1", the up signal Up0 from the AND circuit 121 becomes low level. Further, because the data signal D3 is high level "1", the enable signal EN0 from the AND circuit 123 becomes low level.

At the time T5, the down signal Down0 of the high level "1" is latched according to the clock signal CLKD, and the down signal 302 becomes high level. Likewise, at the time T2, the up signal Up0 and the enable signal EN0 of the low level "0" are latched, and the up signal 301 and the enable signal 400 become low level.

After the subsequent time T6, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the enable signal 400 are maintained at the low level, and the down signal 302 are maintained at the high level.

As described above, in the example shown in FIG. 8, it is determined that the arrival delay amount of the monitor outputs 200 is larger than the upper limit at the time T4 during the operation of the circuit part 2, and the down signal 302 for stepping down the operating voltage is output at the timing (time T5) responsive to the clock signal CLKD. Also, at the time T4, because the data signal D3 is high level, it is determined that the arrival delay amount of the monitor outputs 200 is larger than the uppermost limit, and the enable signal 400 of the low level is output. As a result, the circuit part 2 stops the operation.

In this example, a variation in the arrival delay amount of the monitor outputs 200 is detected during the operation, and the operation of the circuit part 2 stops to change the operating voltage. However, when the arrival delay amount falls within an allowable range in which the circuit part 2 is operable, the operating voltage may be controlled without stopping the circuit part 2.

Figure 9:
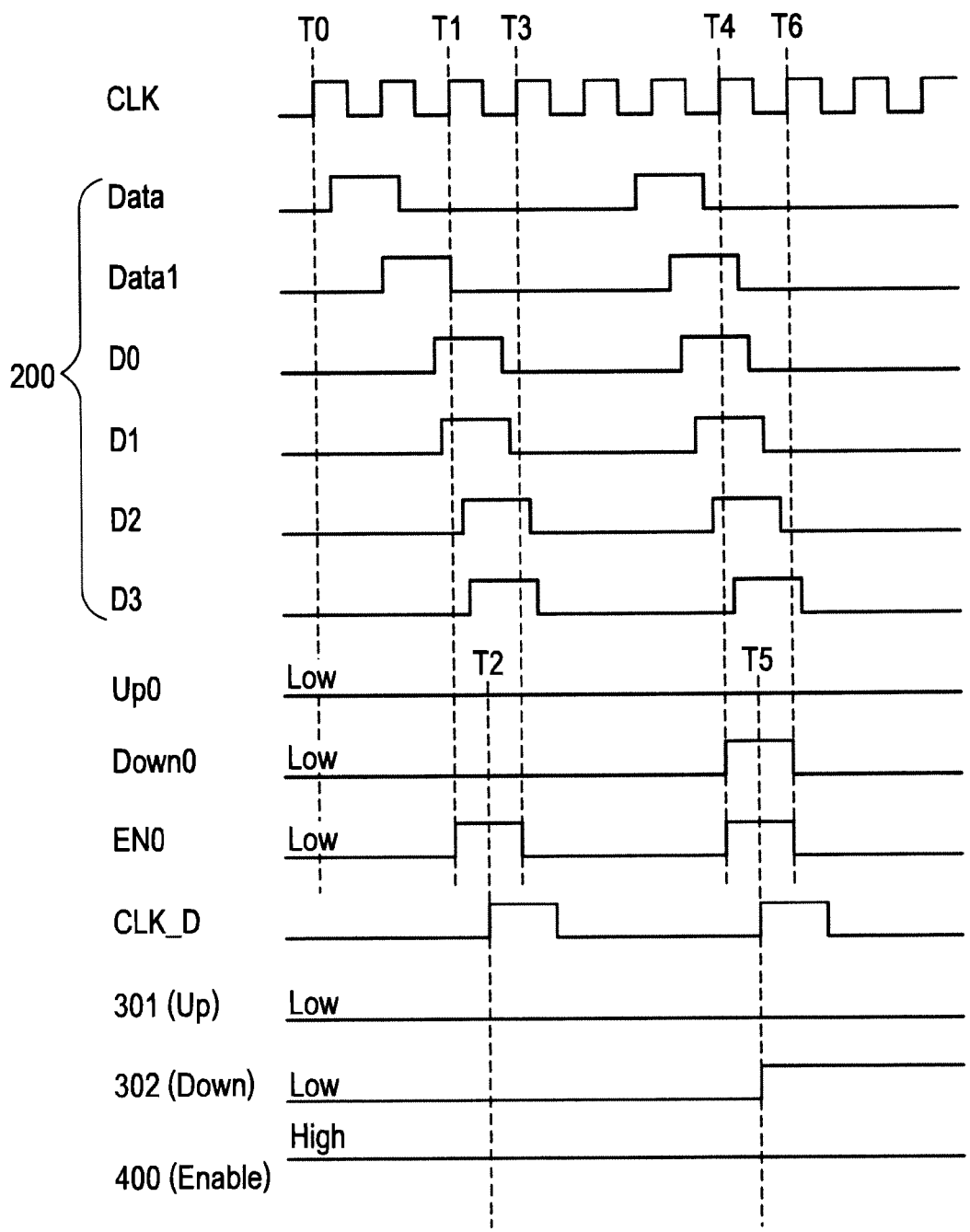
FIG. 9 is a timing chart showing still another example of the voltage control operation (step-down operation) according to the first embodiment.

FIG. 9 is a timing chart showing an example of the voltage control operation (step-down operation) according to the first embodiment. Referring to FIG. 9, a description will be given of the voltage control operation when the arrival delay amount increases, and the present operating voltage is regarded as a value higher than a desired value (voltage value for compensating the process variation of the circuit part 2) within the allowable range in which the circuit part 2 is operable.

Between the time T0 and the time t1, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the down signal 302 are maintained at the low level, and the enable signal 400 is maintained at the high level.

At the time T1, the data signal Data1 of the high level "1" is latched according to the clock signal CLK. At this time, because the data signal D1 is high level "1", the up signal Up0 from the AND circuit 121 becomes low level. Also, because the data signal D2 is low level "0", the down signal Down0 from the AND circuit 122 becomes low level. Further, because the data signal D0 is high level "1" and the data signal D3 is low level "0", the enable signal EN0 from the AND circuit 123 becomes high level.

At the time T2, the enable signal EN0 of the high level "1" is latched according to the clock signal CLKD, and the enable signal 400 is maintained at the high level. Likewise, at the time T2, the up signal Up0 and the down signal Down0 of the low level "0" are latched, and the up signal 301 and the down signal 302 are maintained at the low level.

Between the subsequent time T3 and the time T4, because the data signal Data1 of the low level "0" is latched according to the clock signal CLK, the up signal (Up0), the down signal (Down0), and the enable signal (EN0) become low level.

On the other hand, the surrounding environments are varied between the time T3 and the time T4, thereby varying the arrival delay amount of the monitor outputs 200. In this example, the arrival delay amount of the monitor outputs increases.

At the time T4, the data signal Data1 of the high level "1" is latched according to the clock signal CLK. At this time, because the data signal D2 is high level "1" due to an increase in the arrival delay amount, the down signal Down0 from the AND circuit 122 becomes high level. Also, because the data signal D1 is high level "1", the up signal Up0 from the AND circuit 121 becomes low level. Further, because the data signal D0 is high level "1" and the data signal D3 is low level "0", the enable signal EN0 from the AND circuit 123 becomes high level.

At the time T5, the down signal Down0 of the high level "1" is latched according to the clock signal CLKD, and the down signal 302 becomes high level. Likewise, at the time T2, the enable signal EN0 of the high level "1" is latched, and the enable signal 400 becomes low level. Also, the up signal Up0 of the low level "0" is latched, and the up signal 301 becomes low level.

After the subsequent time T6, because the data signal Data1 of the low level "0" is latched according to the clock signal CLK, the up signal (Up0), the down signal (Down0), and the enable signal (EN0) become low level. During this period, because no clock signal CLKD is input, the up signal 301 and the enable signal 400 are maintained at the low level, and the down signal 302 and the enable signal 400 are maintained at the high level.

As described above, in the example shown in FIG. 9, it is determined that the arrival delay amount of the monitor outputs 200 is larger than the upper limit at the time T4 during the operation of the circuit part 2, and the down signal 302 for stepping down the operating voltage is output at the timing (time T5) responsive to the clock signal CLKD. Also, in this example, because the operating voltage falls within the voltage range that enables a desired processing performance and the normal operation in the circuit part 2, the operating voltage is changed without stopping the circuit part 2.

In FIGS. 8 and 9, the step-down operation is exemplified, but the step-up operation is conducted in the same manner during the operation of the circuit part 2.

It is preferred that the monitor part 11 is disposed in the vicinity of a circuit to be subjected to the variation compensation due to the voltage control (the circuit part 2 in this example). With this configuration, a displacement depending on the location with respect to the circuit part 2 is reduced, and a high-precision variation compensation for the circuit part 2 is enabled. For that reason, in the example illustrated in FIG. 1, the monitor part 11 is disposed in the circuit part 1, but may be disposed in the circuit part 2 as illustrated in FIG. 10. Even when the monitor part 11 is disposed in the circuit part 2, the delay monitor result is output according to the operation of the circuit part 1 regardless of the start of the circuit part 2. Also, the monitor part 11 may be disposed in both of the circuit part 1 and the circuit part 2. In this case, after the circuit part 2 starts, the monitor part is switched to the monitor part disposed in the circuit part 2, thereby enabling the delay monitor precision to be improved. When the circuit part 2 stops (clock gating), the monitor part in the circuit part 2 or the circuit part 1 is used, and when the circuit part 2 is in the power gating state, the monitor part of the circuit part 1 is used. With this configuration, the stable operation and the higher precision can be achieved.

2. Second Embodiment

A semiconductor integrated circuit according to a second embodiment of the present invention will be described with reference to FIGS. 1 and 11 to 14. The semiconductor integrated circuit according to the second embodiment includes the circuit part 1 designed under the first corner condition, the circuit part 2 designed under the second corner condition, and the variable voltage source 3, as in the first embodiment illustrated in FIG. 1. The semiconductor integrated circuit according to the second embodiment is different in only the monitor part 11 and the control part 12, and other configurations are identical with those in the first embodiment, and therefore their detailed description will be omitted.

The monitor part 11 according to the second embodiment includes a ring oscillator having a clock signal as the monitor output 200. The control part 12 counts the number of oscillations of the monitor output 200 in a given period, and determines the signal levels of the up signal 301, the down signal 302, and the enable signal 400 on the basis of a comparison result of a count value and a predetermined value.

Figure 11:
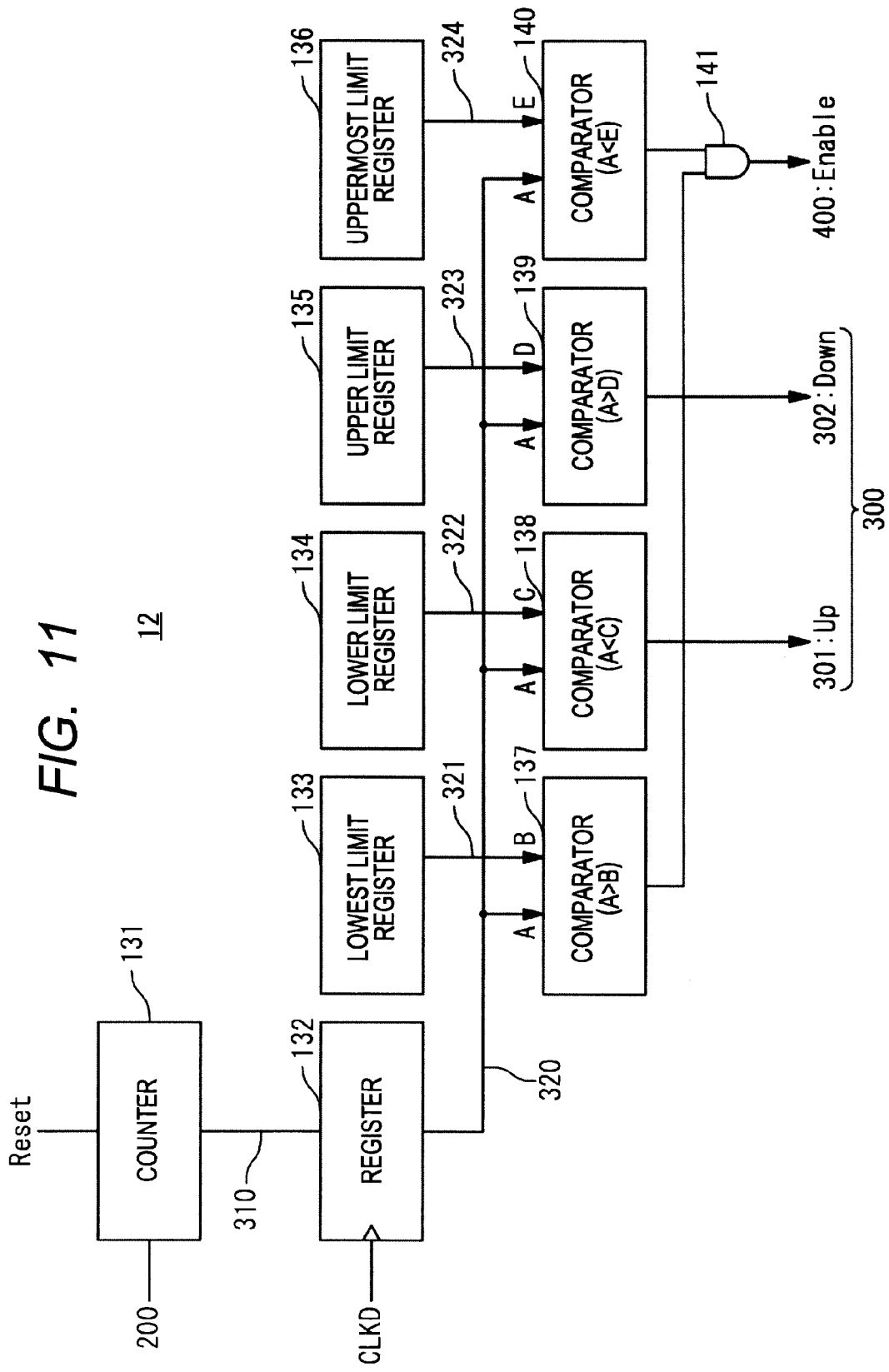
FIG. 11 is a diagram illustrating the configuration of a control part according to a second embodiment of the present invention.
Figure 12A:
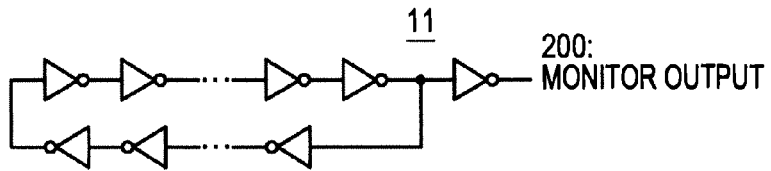
FIGS. 12A and 12B are diagrams showing one example of the configuration of a monitor part according to the present invention.
Figure 12B:

FIG. 11 is a diagram illustrating the configuration of a control part 12 according to a second embodiment of the present invention. Referring to FIGS. 12A and 12B, the control part 12 according to the second embodiment includes a counter 131, a register 132, a lowest limit register 133, a lower limit register 134, an upper limit register 135, an uppermost limit register 136, comparators 137 to 140, and an AND circuit 141.

The counter 131 counts the number of oscillations of the monitor output 200 in a period set by a reset signal (Reset). The register 132 stores a counter output 310 therein, and outputs a stored count value 320(A) to the comparators 137 to 140 at timing responsive to the clock signal CLKD.

In the lowest limit register 133 is set a lowest limit B of the number of oscillation corresponding to the uppermost limit of the delay amount for compensating the second corner condition. In the lower limit register 134 is set the number of oscillations (hereinafter referred to as "lower limit C") corresponding to a reference delay value for determining whether the operating voltage is stepped up, or not. In the upper limit register 135 is set the number of oscillations (hereinafter referred to as "upper limit D") corresponding to a reference delay value for determining whether the operating voltage is stepped down, or not. In the uppermost limit register 136 is set an uppermost limit E of the number of oscillations corresponding to the lowest limit of the delay amount for compensating the second corner condition.

The comparator 137 compares the count value 320(A) with the lowest limit B, and outputs a signal of the high level "1" to the AND circuit 141 when the count value 320 is larger than the lowest limit B (A>B). The comparator 137 outputs the up signal 301 of a logic level responsive to a comparison result of the count value 320(A) and the lower limit C. The comparator 138 outputs the up signal 301 of the high level "1" when the count value 320 is smaller than the lower limit C (A<C). The comparator 139 outputs the down signal 302 of a logic level responsive to a comparison result of the count value 320(A)

and the upper limit D. The comparator 139 outputs the down signal 302 of the high level "1" when the count value 320 is larger than the upper limit D (A>D). The comparator 140 compares the count value 320(A) with the uppermost limit E, and outputs a signal of the high level "1" to the AND circuit 141 when the count value 320 is smaller than the uppermost limit E (A<E).

The AND circuit 141 outputs a logical AND of the output signals from the comparators 137 and 140 as the enable signal 400. That is, the AND circuit 141 outputs the enable signal 400 of the high level "1" when the count value 320(A) is larger than the lowest limit B, and smaller than the uppermost limit E.

FIGS. 12A, 12B and 13A, 13B are diagrams showing examples of the configuration of the monitor part 11 according to the second embodiment. It is preferred that the monitor part 11 according to this embodiment is a ring oscillator in which a plurality (odd numbers) of inverters is feedback-connected in series as shown in FIG. 12A. The monitor part 11 shown in FIG. 12A spontaneously oscillates, and outputs a clock signal in a period within a given range as the monitor output 200. The clock period of the monitor output 200 is delayed according to the process variation of the monitor part 11.

Figure 13A:
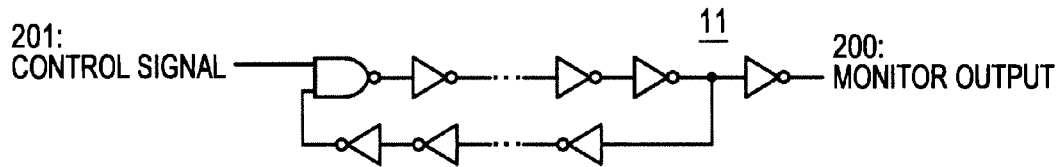
FIGS. 13A and 13B are diagrams showing another example of the configuration of a monitor part according to the present invention.
Figure 13B:
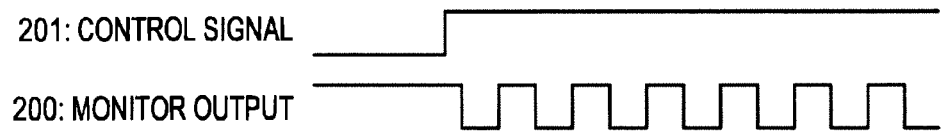

The monitor part 11 may be a ring oscillator whose oscillating operation is controlled through a NAND circuit as shown in FIG. 13A. In this case, as shown in FIG. 13B, the oscillation of the monitor output 200 is controlled according to a control signal 201 that is input to the NAND circuit. In the example shown in FIGS. 13A and 13B, the monitor part 11 oscillates according to the control signal 201 of the high level "1". In this example, an inverter circuit that configures the ring oscillator may be also configured by a NAND circuit. The monitor part 11 may include a NOR circuit instead of the NAND circuit so that the oscillating operation is controlled by the NOR circuit. In this case, the monitor part 11 oscillates when the control signal input to the NOR circuit is low level "0". In this example, the inverter circuit that configures the ring oscillator may be also configured by a NOR circuit.

Figure 14:
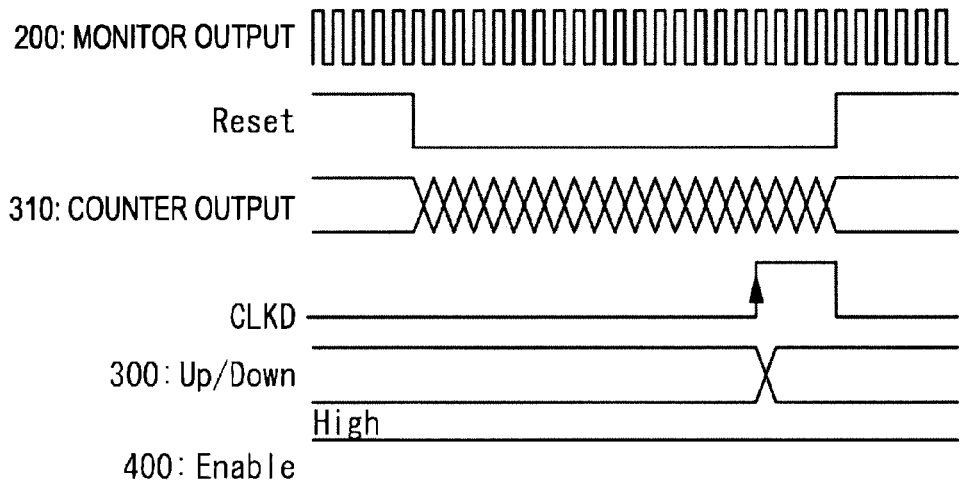
FIG. 14 is a timing chart showing an example of voltage control operation according to a second embodiment.

FIG. 14 is a timing chart showing an example of the voltage control operation according to the second embodiment. Referring to FIG. 14, the control part 12 counts the number of oscillations of the monitor output 200, extracts the count value 320 at timing responsive to the clock signal CLKD, and determines a logic level of an up/down signal 300 and the enable signal 400.

The control part 12 extracts the number of oscillations of the monitor output 200 as the count value 320(A) at timing responsive to the clock signal CLKD, and compares the extracted count value 320(A) with predetermined reference values (the lowest limit B, the lower limit C, the upper limit D, the uppermost limit E) to conduct the voltage control responsive to the delay amount of the monitor output 200 and the start control of the circuit part 2.

In this embodiment, when the count value 320(A) is larger than the lowest limit B and smaller than the uppermost limit E (B<A<E), the enable signal 400 of the high level "1" is output. As a result, the circuit part 2 can operate with the operating voltage for compensating the process variation. On the other hand, when the count value 320(A) is equal to or smaller than the lowest limit B, or is equal to or larger than the uppermost limit E (A≦B, A≧E), the enable signal 400 of the low level "0" is output. As a result, the operation of the circuit part 2 can be stopped while the operating voltage that may induce malfunction is applied.

When the count value 320(A) is smaller than the lowest limit B (A<C), the up signal 301 of the high level "1" is output. As a result, the variable voltage source 3 steps up the operating voltage. On the other hand, when the count value 320(A) is equal to or larger than the lowest limit B (AB), the up signal 301 of the low level "0" is output. During this period, no step-up operation is executed.

When the count value 320(A) is larger than the upper limit D (A>D), the down signal 302 of the high level "1" is output. As a result, the variable voltage source 3 steps down the operating voltage. On the other hand, when the count value 320(A) is equal to or smaller than the upper limit D (A≦D), the down signal 302 of the low level "0" is output. During this period, no step-down operation is executed.

As described above, in this embodiment, the number of oscillations of the ring oscillator is detected as the monitor output, and the operating voltage is controlled according to the comparison results between the detected number of oscillations and the reference values. The number of oscillations is determined according to the process variation of the monitor part 11. For that reason, it is preferred that the monitor part 11 is disposed in the vicinity of a circuit to be subjected to variation compensation due to the voltage control (the circuit part 2 in this example). With this configuration, a displacement depending on the location with respect to the circuit part 2 is reduced, and a high-precision variation compensation for the circuit part 2 is enabled. For that reason, in the example illustrated in FIG. 1, the monitor part 11 is disposed in the circuit part 1, but may be disposed in the circuit part 2 as illustrated in FIG. 10. In this case, the monitor part 11 needs to be operated regardless of the start/stop of the circuit part 2. Also, the monitor part 11 can be disposed in both of the circuit part 1 and the circuit part 2 so as to switch between the monitor part in the circuit part 1 and the monitor part in the circuit part 2 at timing of the start/stop (or power gating) of the circuit part 2.

3. Third Embodiment

As described in the first and second embodiments, control is made so that the circuit part 2 stops even during the operation of the semiconductor integrated circuit. During this period, when the control signal is input from a CPU or another control part which are not shown to the circuit part 2, there is a risk that there is no response, and an error occurs. For that reason, as illustrated in FIG. 15, it is preferred to further include an emulator 4 that operates during the stop of the circuit part 2 and a selector 5 in addition to the semiconductor integrated circuit of the first and second embodiments.

Figure 15:
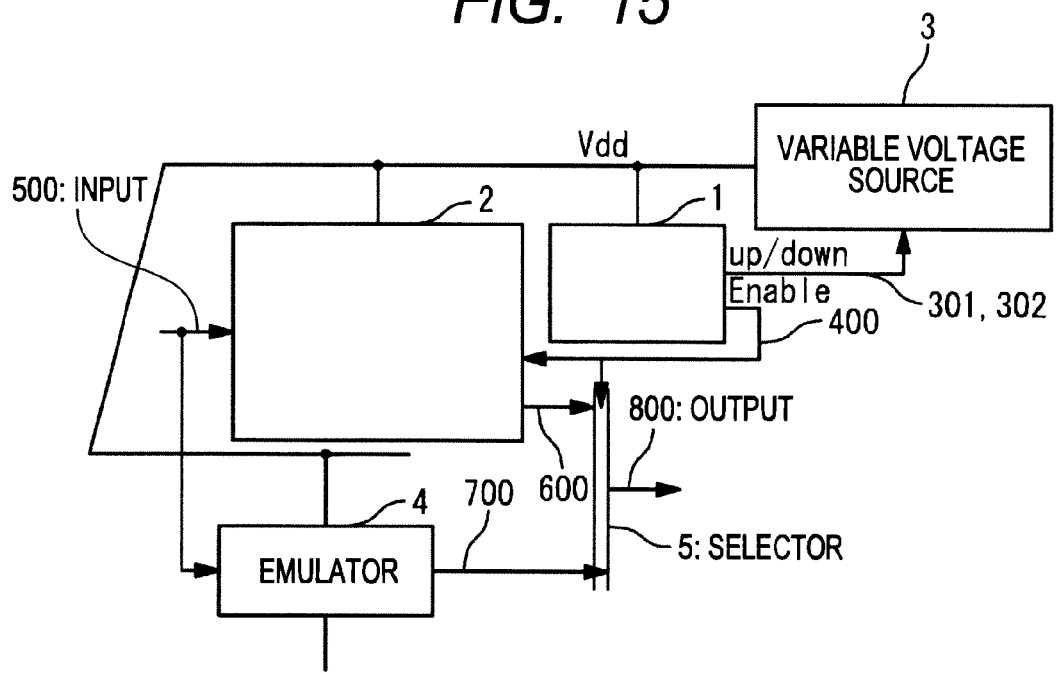
FIG. 15 is a diagram illustrating the configuration of a semiconductor integrated circuit according to a third embodiment of the present invention.

Referring to FIG. 15, the circuit part 2 and the emulator 4 receive a control signal 500 from a CPU or another control part not shown. The circuit part 2 operates to output a signal responsive to the control signal 500 to the selector 5. The emulator 4 is realized by, for example, a small-scaled low-speed processor designed under the first corner condition, and outputs a signal 700 responsive to the control signal 500 to the selector 5. The selector 5 outputs one of the signal 600 and the signal 700 as an output signal 800 to a downstream side (a downstream circuit or a CPU not shown) of the circuit part 2.

When the enable signal 400 is high level "1", that is, when the circuit part 2 operates, the selector 5 selects a signal 600 from the circuit part 2, and outputs the selected signal as an output signal 800. Also, when the enable signal 400 is low level "0", that is, when the circuit part 2 stops, the selector 5 selects a signal 700 from the emulator 4, and outputs the selected signal as an output signal 800.

As described above, the emulator 4 is used instead of the circuit part 2 during the stop of the circuit part 2, thereby enabling an unresponsive state of the circuit part 2 to the control signal 500 from the CPU not shown to be eliminated.

In this example, the emulator 4 may operate even while the circuit part 2 operates, or may stop in response to the start of the operation of the circuit part 2. For example, it is preferred that the operation of the emulator 4 is controlled by clock gating or power gating responsive to the enable signal 400. As a result, the emulator 4 can be stopped during the operation of the circuit part 2 (in a period where the enable signal 400 is high level "1"), and the power consumption of the circuit can be reduced.

In the present invention, because the circuit block designed under the broader corner condition is first driven, it is difficult to generate malfunction caused by the initial voltage. Also, the operation of the circuit block designed under the narrower corner condition is stopped while the operating voltage is controlled to an appropriate voltage. This makes it possible to prevent the malfunction of the overall semiconductor integrated circuit. According to the present invention, the circuit part 1 that is broader in the voltage range that enables the desired speed performance and the normal operation is first operated, whereby the operating voltage is set to a value conforming to the second corner condition, and the circuit part 2 is operated. For that reason, the semiconductor integrated circuit can start the operation without any delay from the start time, and the process variation of the circuit part 2 is compensated by the controlled operating voltage.

According to the present invention, there can be realized the start control of the semiconductor integrated circuit that includes a portion designed by the process corner narrower than usual assuming that the operating voltage is controlled to compensate the process variation, and actually controls the operating voltage to compensate the process variation.

Further, the operating voltage for compensating the process variation can be set while preventing the malfunction of processing during the operation of the semiconductor integrated circuit.

The embodiments of the present invention have been described in detail above. However, specific configurations are not limited to the above embodiments, but the present invention encompasses a change or modification thereof without departing from the subject matter of the present invention. In the above-mentioned embodiments, the supply voltage Vdd is controlled as the operating voltage. However, the present invention is not limited to this configuration, but a substrate voltage Vsb or a threshold voltage Vth may be controlled. For example, the substrate voltage VSB or both of the supply voltage Vdd and the substrate voltage VSB are controlled by the circuit part 1 designed under the first corner condition shown in FIG. 2 to control the threshold voltage Vth so as to compensate the process variation corresponding to the second corner condition shown in FIG. 2.

As the substrate voltage VSB, it is necessary to control an n-well potential Vnw in a pMOS and a p-well potential Vpw in an nMOS. As the monitor part 11, both of an NAND ring oscillator and a NOR ring oscillator are added, and compared in an oscillating frequency (counter value) with each other. When the NAND side is larger than a given value, the p-well potential Vpw is decreased (reverse bias direction) or the n-well potential Vnw is decreased (forward bias direction). On the other hand, when the NOR side is larger than the given value, the n-well potential Vnw is increased (reverse bias direction) or the p-well potential Vpw is increased (forward bias direction). As a result, an unbalance of the MOS and the nMOS can be reduced.

When only the substrate voltage VSB (n-well potential Vnw and p-well potential Vpw) is controlled, the n-well potential Vnw and the p-well potential Vpw are so changed as to eliminate the delay amount of the monitor part 11 or a difference in the counter value between the NAND and NOR ring oscillators. In more detail, when the arrival delay amount or the counter value is large, the substrate voltage VSB is set to the reverse bias side, that is, the operation of increasing the n-well potential Vnw and the operation of decreasing the p-well potential Vpw are alternately implemented. In this example, when the difference in the counter value between the NAND and NOR ring oscillators becomes a given value or larger, control is made so that not both but only one of those counter values is changed to eliminate the difference. As a result, both of the delay amount and a p/n balance can be adjusted.

Also, when both of the supply voltage Vdd and the substrate voltage VSB (the n-well potential Vnw and the p-well potential Vpw) are controlled, the n-well potential Vnw and the p-well potential Vpw are so changed as to eliminate the delay amount of the monitor part 11 or the difference in the counter value between the NAND and NOR ring oscillators after the supply voltage Vdd has been set. For example, when the arrival delay amount or the counter value is large, the supply voltage Vdd is first stepped down. When the difference in the counter value between the NAND and NOR ring oscillators becomes a given value or larger, control is so made as to change one potential of the substrate VSB, that is, the n-well potential Vnw or the p-well potential Vpw to eliminate the difference. As a result, both of the delay amount and a p/n balance can be adjusted. The supply voltage Vdd and the substrate voltage VSB are controlled to optimize the threshold voltage Vth, and a power in a given delay amount can be optimized.

Figure 16:
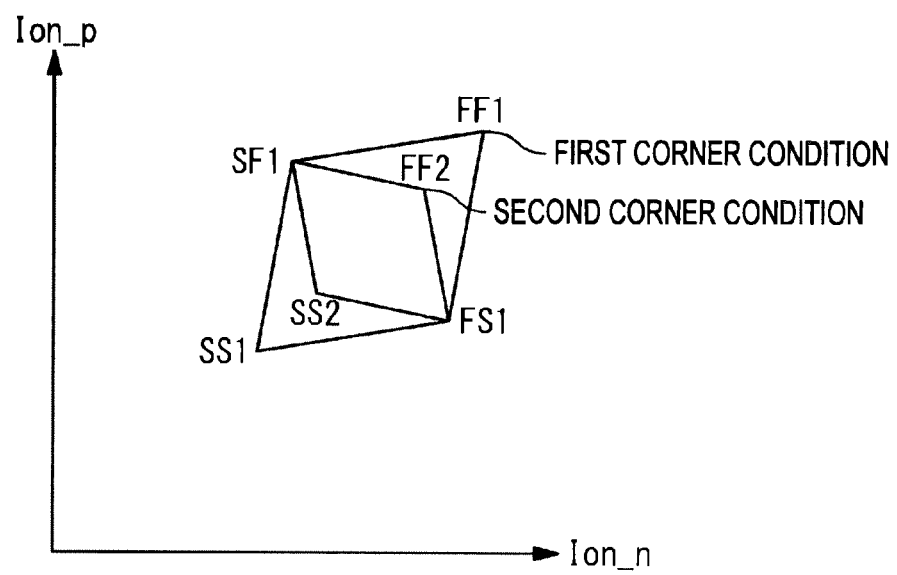
FIG. 16 is a graph showing another example of the corner condition according to the present invention.

Also, when only the supply voltage Vdd is controlled, the process variation of the circuit designed under the narrower process condition can be compensated. The process corners FF1 and SS1 of the first corner condition shown in FIG. 16 are broader than the process corners FF2 and SS2 of the second corner condition, and the process corners SF1 and FS1 of both the conditions are common thereto. In this case, only the supply voltage Vdd is controlled by the circuit part 1 designed under the first corner condition so as to compensate the process variation corresponding to the second corner condition shown in FIG. 16.

What is claimed is:

1. A semiconductor integrated circuit, comprising:
   a first circuit part that is designed under a first corner condition with respect to a process variation;
   a second circuit part that is designed under a second corner condition narrower than the first corner condition; and
   a control part that changes an operating voltage supplied to the first circuit part and the second circuit part according to a delay amount of the first circuit part, and starts the second circuit part when a delay characteristic caused by a change in the operating voltage conforms to a delay characteristic under the second corner condition.

2. The semiconductor integrated circuit according to claim 1,
   wherein the control part outputs an enable signal for operating the second circuit part when the delay amount conforms to the delay characteristic of the second corner condition, and
   wherein the second circuit part starts operation according to the enable signal.

3. The semiconductor integrated circuit according to claim 1, further comprising:
   a variable voltage source that applies the operating voltage to the first circuit part and the second circuit part; and a monitor part that detects the delay amount of the first circuit part which operates according to the operating voltage, wherein the control part instructs, with an instruction, the variable voltage source to change the operating voltage according to a comparison result of the delay amount and a first reference value, and wherein the variable voltage source changes the operating voltage according to the instruction received from the control part.

4. The semiconductor integrated circuit according to claim 3, wherein the control part outputs an enable signal for operating the second circuit part according to a comparison result of the delay amount and a second reference value.

5. The semiconductor integrated circuit according to claim 4, wherein the monitor part includes a ring oscillator, wherein the control part includes a counter that counts a first oscillation number of the ring oscillator, a first register having a second oscillation number set based on the first reference value, and a second register having a third oscillation number set based on the second reference value, and wherein the control part outputs a control signal for changing the operating voltage according to a comparison result of the first oscillation number and the second oscillation number, and outputs the enable signal according to a comparison result of the first oscillation number and the third oscillation number.

6. The semiconductor integrated circuit according to claim 3, wherein the monitor part includes a critical path replica and a plurality of delay circuits connected in series, and detects the delay amount on the basis of a phase difference of respective data signals delayed by the delay circuits through the critical path replica.

7. The semiconductor integrated circuit according to claim 3, wherein the monitor part is disposed in the second circuit part.

8. The semiconductor integrated circuit according to claim 1, wherein the control part changes a substrate voltage which is applied to the first circuit part and the second circuit part according to the delay amount of the first circuit part.

9. The semiconductor integrated circuit according to claim 1, wherein the control part changes a supply voltage that is applied to the first circuit part and the second circuit part according to the delay amount of the first circuit part.

10. The semiconductor integrated circuit according to claim 1, wherein the control part is mounted on the first circuit part.

11. The semiconductor integrated circuit according to claim 1, wherein each of the first corner condition and the second corner condition includes a fast condition and a slow condition which are process corners, and wherein the fast condition in the first corner condition is set to be faster than the fast condition in the second corner condition, and the slow condition in the first corner condition is set to be slower than the slow condition in the second corner condition.

12. The semiconductor integrated circuit according to claim 1, wherein the control part outputs a stop signal for stopping the second circuit part when the delay amount does not conform to the second corner condition, and wherein the second circuit part stops its operation according to the stop signal.

13. The semiconductor integrated circuit according to claim 12, further comprising:

an emulator; and a selector that selects and outputs one of a first output signal from the second circuit part and a second output signal from the emulator, wherein the selector selects and outputs the first output signal while the second circuit part operates, and selects and outputs the second output signal while the second output signal stops.

14. An operating voltage control method, comprising:

changing, by a control part, according to a delay amount of a first circuit part designed under a first corner condition with respect to a process variation, an operating voltage supplied to the first circuit part and a second circuit part designed under a second corner condition narrower than the first corner condition; and starting, by the control part, the second circuit part when a delay characteristic caused by a change in the operating voltage conforms to a delay characteristic in the second corner condition.

* * * * *